Dec. 24, 1968 G. D. FISHER 3,418,591
LOW NOISE AMPLIFIER WITH MINIMUM CROSS MODULATION DISTORTION
Filed June 13, 1966
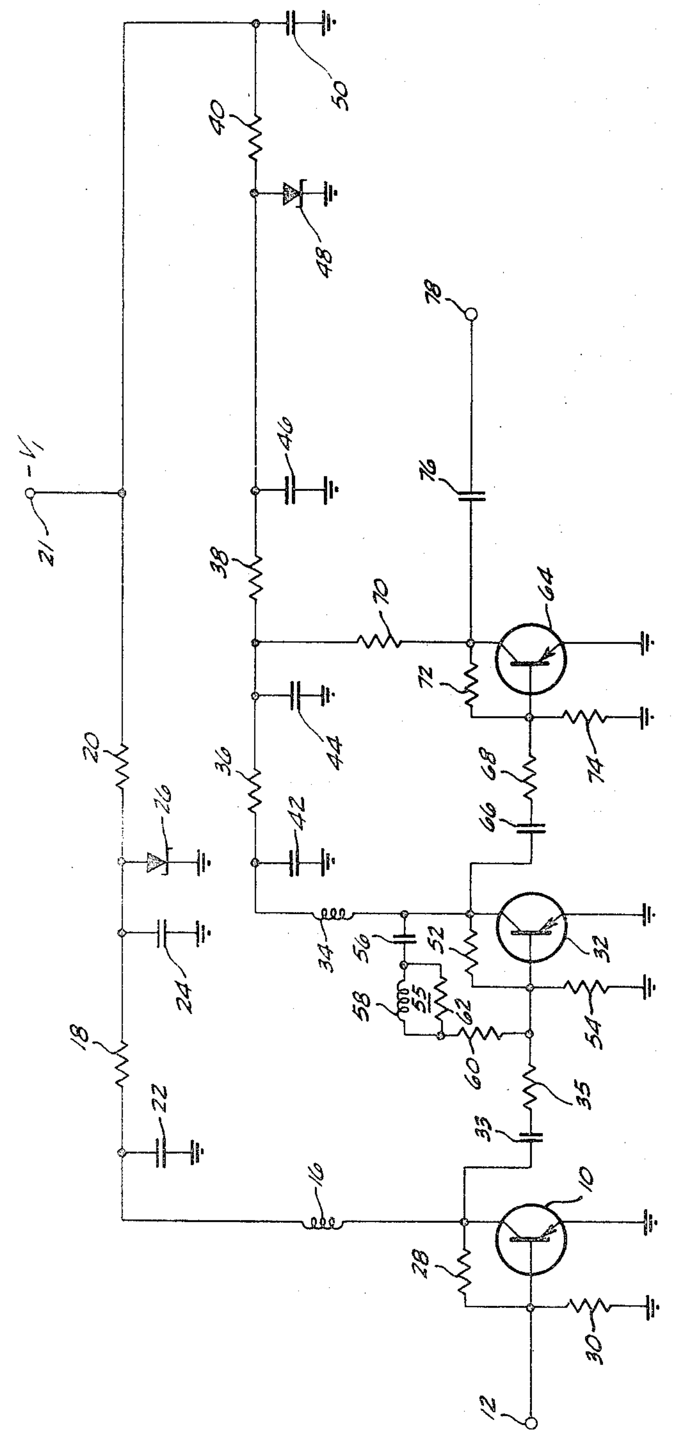
INVENTOR.
GAYTHOR D. FISHER,
BY Paul M. Cole
ATTORNEY.

United States Patent Office
3,418,591
Patented Dec. 24, 1968

3,418,591
LOW NOISE AMPLIFIER WITH MINIMUM CROSS MODULATION DISTORTION

Gaythor D. Fisher, Woodland Hills, Calif., assignor to Hughes Aircraft Company, Culver City, Calif., a corporation of California Filed June 13, 1966, Ser. No. 557,302
4 Claims. (Cl. 330—21)

This invention relates to amplifiers, and more particularly relates to a circuit for amplifying VHF signals with minimum noise and with minimum cross modulation distortion.

In certain applications, such as the transmission of television signals in the VHF frequency range (54 mc. to 216 mc.), it is necessary to amplify signals in various channels throughout the frequency range by the same amount. Moreover, such amplification should be achieved with the introduction of a minimum amount of noise and with minimum distortion due to cross modulation of signals in different ones of channels. However, the noise figure and cross modulation distortion in presently available amplifiers are excessive for applications of the type mentioned above.

Accordingly, it is an object of the present invention to provide an amplifier circuit which achieves constant amplification of signals over a wide frequency range with a lower noise figure and with less cross modulation distortion than has heretofore been obtained.

It is a further object of the present invention to provide a low noise amplifier for amplifying signals by at least 20 db over a frequency range extending from essentially 54 mc. to essentially 216 mc.

In accordance with the foregoing objects, the amplifier circuit of the invention includes first, second, and third transistors each having an emitter electrode, a base electrode, and a collector electrode, the emitter electrodes of each of the transistors being coupled together. The collector electrode of the first transistor is coupled to the base electrode of the second transistor, and the collector electrode of the second transistor is coupled to the base electrode of the third transistor. First and second inductors each have one terminal coupled to the respective collector electrodes of the first and second transistors. Operating potentials are applied to the other terminal of each of the first and second inductors, to the collector electrode of the third transistor, and to the emitter electrodes of the first, second, and third transistors. A capacitor, a third inductor, and a first resistor are coupled in series between the collector and base electrodes of the second transistor, with a second resistor being coupled in parallel with the third inductor. A signal to be amplified is applied between the base and emitter electrodes of the first transistor, while the amplified output signal is obtained between the collector and emitter electrodes of the third transistor.

Additional objects, advantages and characteristic features of the invention will become readily apparent from the following detailed descripiton of a preferred embodiment of the invention when considered in conjunction with the accompanying drawing in which the sole figure schematically illustrates an amplifier circuit in accordance with the invention.

Referring with greater particularity to the drawing, an amplifier circuit according to the invention may be seen to include three amplifying stages, the first of which is constructed around a PNP transistor 10. Input signals to be amplified are applied to the circuit between an input terminal 12 and a level of reference potential designated as ground. The input terminal 12 is connected to the base electrode of transistor 10, while the emitter electrode of the transistor 10 is connected to ground. The collector electrode of the transistor 10 is connected by means of an inductor 16 and resistors 18 and 20, all connected in series, to a power supply terminal 21 which furnishes an operating potential designated as $-V_1$. A capacitor 22 is connected between the junction between inductor 16 and resistor 18 and ground, while a capacitor 24 and a Zener diode 26 are connected in parallel between the junction between resistors 18 and 20 and the ground level. A bias network for the transistor 10 includes a resistor 28 connected between the collector and base electrodes of the transistor 10 and a resistor 30 connected between the base electrode and ground.

Inductor 16 is selected to provide sufficient inductance to compensate for shunt capacitance in the collector circuit of the transistor 10 and thereby raise the frequency at which the transistor gain starts to decrease with increasing frequency. Resistors 18 and 20 and capacitors 22 and 24 constitute a filter network, with the Zener diode 26 maintaining a constant voltage across capacitor 24. Resistors 28 and 30 are selected to bias the transistor 10 for minimum noise operation.

The second amplifying stage for the circuit is constructed around a second grounded emitter PNP transistor 32 having its base electrode coupled to the collector electrode of the transistor 10 via serially connected capacitor 33 and resistor 35. The collector electrode of the transistor 32 is connected via an inductor 34 and resistors 36, 38 and 40, all connected in series, to the power supply terminal 21. A capacitor 42 is connected between the junction between inductor 34 and resistor 36 and ground. while a capacitor 44 is connected between junction between resistors 36 and 38 and the ground level. A capacitor 46 and a constant voltage maintaining Zener diode 48 are connected in parallel between the junction between resistors 38 and 40 and ground, while a capacitor 50 connects the power supply terminal 21 with the ground level. Resistors 36, 38 and 40 and capacitors 42, 44, 46 and 50 constitute a filter network, while inductor 34 serves to extend the constant gain level of the transistor 32 to higher frequencies in the same manner as described above with respect to inductor 16 and transistor 10. A bias network for the transistor 32 includes a resistor 52 connected between the collector and base electrodes of the transistor 32 and a resistor 54 connected between the base electrode and ground.

In order to widen the frequency passband of the circuit, as well as to reduce cross modulation distortion, a special frequency sensitive negative feedback network 55 is provided for the second stage amplifying transistor 32. The feedback network 55 includes a capacitor 56, an indicator 58, and a resistor 60, all connected in series between the collector and base electrodes of the transistor 32, with a resistor 62 being connected in parallel with the inductor 58. Since the amount of feedback provided by the network 55 is inversely proportional to frequency, signals at the low frequency end of the passband are attenuated more than signal at the high frequency end so as to compensate for high frequency attenuation inherent in the circuit and thereby facilitate the desired extension of the passband. Moreover, the feedback network 55 functions to reduce cross modulation distortion by reducing the effect of nonlinearities in the transistor 32. The reduction in cross modulation distortion is enhanced by including the resistor 35 in the coupling circuit between the collector electrode of transistor 10 and the base electrode of transistor 32 in order to drive the transistor 32 from a more nearly constant current source and thereby minimize the effects of nonlinearities due to the base-emitter diode of the transistor 32.

The third amplifying stage for the circuit is constructed around a third grounded emitter PNP transistor 64. Signals from the collector electrode of the transistor 32 are applied to the base electrode of the transistor 64 through serially connected capacitor 66 and resistor 68, the resistor 68 serving to further reduce cross modulation distortion in the circuit by driving the transistor 64 from a more nearly constant current source. The collector electrode of transistor 64 is connected through a resistor 70 to the junction between resistors 36 and 38. A resistor 72 connected between the collector and base electrodes of the transistor 64 and a resistor 74 connected between the base and emitter electrodes function as a bias network for the transistor 64. The collector electrode of the transistor 64 is coupled by means of a capacitor 76 to a terminal 78 from which amplified output signals from the circuit may be obtained.

As illustrative of a particular circuit which has been built and operated successfully, the following exemplary circuit component values are set forth. It should be understood, however, that these exemplary values are included solely for the purpose of illustration, and are in no way to be construed as a limitation upon the invention. All resistors are quarter watt, ±5% unless otherwise noted.

Resistors:
- 18—1.3K ohms
- 20—1.5K ohms, ½ watt
- 28—9.1K ohms
- 30—1K ohms
- 35—68 ohms
- 36—560 ohms
- 38—20 ohms
- 40—100 ohms, ½ watt
- 52—15K ohms
- 54—1K ohms
- 60—390 ohms
- 62—750 ohms
- 68—43 ohms
- 70—560 ohms
- 72—15K ohms
- 74—1K ohms Capacitors:
- 22—1000 pf.
- 24—.01 μf.
- 33—1000 pf.
- 42—.001 μf.
- 44—.01 μf.
- 46—.01 μf.
- 50—.01 μf.
- 56—1000 pf.
- 66—4.3 pf.
- 76—1000 pf.

Inductors:
- 16—.22 μh.
- 34—.33 μh.
- 58—.22 μh.

Potentials:
- $-V_1$—28 volts

Transistors:
- 12—TIXM101, made by Texas Instruments.
- 32—2N2929, made by Motorola.
- 64—2N2929, made by Motorola.

An amplifier circuit which has been built in accordance with the foregoing description, and having the specific component values set forth above, has amplified signals with a power gain of 20 db over a frequency range extending from essentially 54 mc. to essentially 216 mc. with a noise figure of less than 3 db and with a third order spurious response 70 db below equal amplitude carrier signals in the vicinity of 100 mc. and with a carrier output power level at −15 dbm. On the other hand, known prior art amplifiers having comparable spurious response levels provide noise figures of 8–14 db over the frequency range of 54 mc. to 216 mc. and while other known prior art amplifiers can provide a 4 db noise figure over a narrower frequency range extending from 100 to 200 mc., the third order spurious response of these amplifiers is only 30 db below −15 dbm carrier signals in the vicinity of 100 mc. Thus, it may be seen that in contrast with the prior art, the amplifier circuit of the present is able to minimize both the noise figure and the cross modulation distortion simultaneously, while at the same time providing substantially constant amplification over a bandwidth of two octaves.

Although the present invention has been shown and described wtih reference to a particular embodiment, nevertheless various changes and modifications obvious to a person skilled in the art to which the invention pertains are deemed to lie within the spirit, scope and contemplation of the invention as set forth in the appended claims.

What is claimed is:

1. An amplifier circuit comprising: first, second, and third transistors each having an emitter electrode, a base electrode, and a collector electrode; the emitter electrodes of each of said transistors being coupled together; means for applying a signal to be amplified between the base and emitter electrodes of said first transistor; first circuit means intercoupling the collector electrode of said first transistor with the base electrode of said second transistor; second circuit means intercoupling the collector electrode of said second transistor with the base electrode of said third transistor; a first inductor having one terminal coupled to the collector electrode of said first transistor; a second inductor having one terminal coupled to the collector electrode of said second transistor; means for applying operating potentials to the other terminal of each of said first and second inductors, to the collector electrode of said third transistor, and to the emitter electrode of said first, second, and third transistors; a capacitor, a third inductor, and a first resistor coupled in series between the collector and base electrodes of said second transistor; a second resistor coupled in parallel with said third inductor; and means for obtaining an amplified output signal between the collector and emitter electrodes of said third transistor.

2. An amplifier circuit according to claim 1 wherein each of said first and second circuit means includes a serially connected capacitor and resistor.

3. An amplifier circuit according to claim 1 wherein said means for applying operating potentials includes: a power supply terminal, a first filter network coupled between said power supply terminal and the other terminal of said first inductor, a second filter network coupled between said power supply terminal and the other terminal of said second inductor, said second filter network having an intermediate terminal, and a third resistor coupled between said intermediate terminal and the collector electrode of said third transistor.

4. An amplifier circuit comprising: first, second and third transistors each having an emitter electrode, a base electrode, and a collector electrode; the emitter electrodes of each of said transistors being coupled together; means for applying a signal to be amplified between the base and emitter electrodes of said first transistor; a first inductor having one terminal coupled to the collector electrode of said first transistor; a second inductor having one terminal coupled to the collector electrode of said second transistor; a power supply terminal; a first filter network coupled between said power supply terminal and the other terminal of said first inductor; a second filter network coupled between said power supply terminal and the other terminal of said second inductor; said second filter network having an intermediate terminal; a first capacitor, a third inductor, and a first resistor coupled in series between the collector and base electrodes of said second transistor; a second resistor coupled in parallel with said third inductor; a third resistor coupled between said intermediate terminal and the collector electrode of said third transistor; a second capacitor and a fourth resistor coupled in series between the collector electrode of said first transistor and the base electrode of said second transistor; a third capacitor and a fifth resistor coupled in series between the collector electrode of said second transistor and the base electrode of said third transistor; a sixth resistor coupled between the collector and base electrodes of said first transistor; a seventh resistor coupled between the base and emitter electrodes of said first transistor; an eight resistor coupled between the collector and base electrodes of said second transistor; a ninth resistor coupled between the base and emitter electrodes of said second transistor, a tenth resistor coupled between the collector and base electrodes of said third transistor; an eleventh resistor coupled between the base and emitter electrodes of said third transistor; and means for obtaining an amplified output signal between the collector and emitter electrodes of said third transistor.

No references cited.

JOHN KOMINSKI, *Primary Examiner.*

S. H. GRIMM, *Assistant Examiner.*

U.S. Cl. X.R.

330—22, 28, 31, 109